US008446162B2

(12) United States Patent
Nose et al.

(10) Patent No.: US 8,446,162 B2

(45) Date of Patent: May 21, 2013

(54) SEMICONDUCTOR INTEGRATED CIRCUIT DEVICE WITH TEST CIRCUIT AND TEST METHOD THEREFOR

(75) Inventors: Koichi Nose, Tokyo (JP); Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 435 days.

(21) Appl. No.: 12/744,188

(22) PCT Filed: Nov. 21, 2008

(86) PCT No.: PCT/JP2008/071230

§ 371 (c)(1), (2), (4) Date: May 21, 2010

(87) PCT Pub. No.: WO2009/066764

PCT Pub. Date: May 28, 2009

(65) Prior Publication Data

US 2010/0259292 A1 Oct. 14, 2010

(30) Foreign Application Priority Data

Nov. 21, 2007 (JP) ................................ 2007-301127

(51) Int. Cl.
*G01R 31/26* (2006.01)

(52) U.S. Cl.
USPC .................................. 324/750.3; 324/762.01

(58) Field of Classification Search
None
See application file for complete search history.

(56) References Cited

U.S. PATENT DOCUMENTS 5,760,599 A * 6/1998 Ehiro ........................ 324/762.09
2008/0232538 A1* 9/2008 Goishi ........................... 377/19

FOREIGN PATENT DOCUMENTS

JP 52-46871 A 4/1977
JP 2001229699 A 8/2001
JP 2001318730 A 11/2001
JP 2002214300 A 7/2002
JP 2006073081 A 3/2006

OTHER PUBLICATIONS

International Search Report for PCT/JP2008/071230 mailed Jan. 27, 2009.

* cited by examiner

*Primary Examiner* — Minh N Tang

(57) ABSTRACT

A semiconductor integrated circuit device includes: a normal output signal counter that counts number of times a normal output signal is output by the circuit under test in response to a preset one of the input signals of the input signal set, in case where a circuit under test repeats processing on each of one or more input signals of an input signal set sequentially, a plural number of times.

8 Claims, 7 Drawing Sheets

CLOCK SIGNAL
RESET SIGNAL
RESET
INPUT SIGNAL COUNTER
40
30
INPUT SIGNAL DISTURBANCE UNIT
SEMICONDUCTOR INTEGRATED CIRCUIT DEVICE
60
INPUT SIGNAL
INPUT SIGNAL STORAGE UNIT
CIRCUIT UNDER TEST
OUTPUT SIGNAL
NORMAL OUTPUT SIGNAL COUNTER
DELAY MARGIN OUTPUT
50
20
IDEAL OUTPUT SIGNAL
10

SEMICONDUCTOR INTEGRATED CIRCUIT DEVICE WITH TEST CIRCUIT AND TEST METHOD THEREFOR

The present application is the National Phase of PCT/JP2008/071230, filed on Nov. 21, 2008, which claims priority rights based on the Japanese Patent Application 2007-301127, filed in Japan on Nov. 21, 2007, the disclosure of which is to be incorporated in its entirety herein by reference.

TECHNICAL FIELD

This invention relates to a semiconductor integrated circuit device and a test method therefor.

BACKGROUND ART

A semiconductor integrated circuit device is tested, before its shipment, as to whether or not its internal logic circuit or memory circuit may be in normal operation. FIG. 4 depicts a block diagram showing a conventional semiconductor integrated circuit device 160. Referring to FIG. 4, in a conventional test method, after a test input signal is applied from an external tester 200 to the inside of the semiconductor integrated circuit device 160 and a clock signal is generated, a comparison circuit 120 determines whether or not the output signal of a device under test 150 coincides with an ideal output signal. The frequency of the clock signal, which can be generated by the tester 200 and strobed from the outside into the inside of the semiconductor integrated circuit device 160, is generally 100 MHz or less. Therefore, it is necessary to conduct a test using a clock signal slower than the clock signal used during the normal operation of the semiconductor integrated circuit device 160. Faulty operations that may be detected with this test scheme are normally those not dependent on the operational speed, examples of which include open faults and short faults.

Recently, an at-speed test scheme is coming into use, in which a clock signal and a test input signal are generated within the semiconductor integrated circuit device 160, and are in operation at a rated frequency actually employed to observe the behavior. For example, Patent Document 1 shows a scheme in which a clock signal is generated by a clock signal generator (not shown in the drawing) provided in the semiconductor integrated circuit device 160, and in which the test input signal is generated by a BIST (Built-In Self Test) circuit (not shown in the drawing) provided in the inside of the semiconductor integrated circuit device 160. In this case, the BIST circuit generates the input signal, every clock cycle, the generated clock signal is delivered to a circuit under test 150, and the comparison circuit 120 compares an output signal of the circuit under test 150 to the ideal output signal to determine whether the output signal is normal or not. This scheme allows to detect a fault that depends on the operating speed, for example, such a fault in which the operating speed is slower than the rated speed.

[Patent Document 1] JP Patent Kokai Publication No. JP-P2006-073081A

[Patent Document 2] JP Patent Kokai Publication No. JP-P2001-318730A

SUMMARY

The disclosures of the Patent Documents 1 and 2 are to be incorporated herein by reference. The following analysis is made by the present inventor.

If a BIST circuit, provided within the semiconductor integrated circuit device 160, as in Patent Document 1, is used, many different sorts of data need to be generated within the BIST device. Hence, there is raised a problem that the area of the BISI circuit is increased. In addition, such a problem may be presented in which it is difficult to predict an ideal output signal corresponding to the test input signal. Therefore, there is a need for a scheme in which the input signal and the ideal output signal are generated in an external tester 200 and are delivered at a lower speed from outside into the semiconductor integrated circuit device 160, and in which the test result is output at a lower speed to outside the semiconductor integrated circuit device 160.

Recently, importance is also attached to detection of latent microdefects. By the latent microdefects are meant those faults which are not obstructive to the system operation under a rated condition but which lower the tolerance of the system against increasing the operational speed or against decreasing the power supply voltage. That is, the latent microdefects tend to give rise to a lowered operational speed or to an abnormal increase in power, depending upon an environment in a destination of shipment, thus possibly leading to deterioration with lapse of time.

To detect the latent microdefects, it is not sufficient to test the semiconductor integrated circuit device as to whether or not the device may be in operation under rated conditions. Viz., it is also necessary that the operational tolerance (margin) of the semiconductor integrated circuit device is quantitatively measured to check to see whether or not the device, operating under the rated condition, is inferior in its tolerance against increasing the operational speed or against lowering the power supply voltage in comparison with a device not suffering from the latent microdefects.

Among the methods known for detecting the maximum operation frequency in the semiconductor integrated circuit device, there is a method of observing the delay margin according to which the clock frequency is raised to higher than the rated frequency in order to measure the frequency that allows for the operation. If it is possible to observe such margin, not only the rated operation may be performed, as conventionally, but also the information regarding the possible presence of the latent microdefects may be obtained. In a method described in Patent Document 2, a device in a chip, such as BIST, is used.

However, if the BIST is used, as in the method described in Patent Document 2, there is presented a problem that, since a larger number of different sorts of data are generated in the inside of the BIST, a larger proportion of the area of the BIST is taken up for generating the data. Therefore, it is difficult to realize a means for predicting an ideal output signal matched to the BISI input signal.

In the method of transmitting normal/abnormal decision signals that cover the total of the periods to the tester 200, provided outside of the semiconductor integrated circuit device 160, in order to check for margins, as in FIG. 4, a test is carried out in one of the following two ways. That is, the limit of the frequency of a signal that can be received by the tester 200, or the limit of the operation frequency of an input/output circuit of the semiconductor integrated circuit device 160 (not higher than 100 MHz), is taken into consideration, and the clock rate is lowered to this frequency range to carry out the test. Or, to conduct a test, the measurement is not carried out continuously, but is halted from time to time in keeping pace with the frequency range.

However, the former way of testing suffers from a problem that the margin that allows for a test is restricted, while the latter way of testing suffers from a problem that the measurement time is prolonged.

On the other hand, it is supposed that the input signal from the tester 200 to the semiconductor integrated circuit device 160 is a repetition of the same input signal, such as I0, as in FIG. 6, and only the disturbance in the test signal is progressively raised to detect the amount of disturbance tolerance. In such case, the input signal remains the same during the period of detecting the maximum frequency. Hence, the low-speed tester 200 that is unable to change over a command with the operating speed of the LSI is able to cope with the situation.

However, in a march test, such as one shown in FIG. 7, carried out on a memory circuit, it is necessary to detect a phenomenon in which the amount of disturbance tolerance in a given cycle of the memory circuit are varied depending on which command has been executed in a previous cycle. If, in such case, an input signal set, composed of several input signals, is repetitively supplied, it is necessary to apply a disturbance, such as delay, to a specified input signal to observe the tolerable amount of disturbance. In this case, an input signal that differs from one cycle to the next needs to be generated and delivered to the circuit under test 150. Viz., the signal outputting speed possible with the tester 200 has to be taken into account for the input signal as in the case of processing of the output signal. In addition, the limit of the operation frequency of the input/output circuit of the semiconductor integrated circuit device 160 (100 MHz or less) has to be taken into account. Thus, in order to keep with the frequency range, the test needs to be conducted as the clock frequency is lowered in agreement with this frequency range, or as the circuit under test 150 is not run in operation in continuity but is halted from time to time. However, in the former case, the range of the delay margin that can be checked is restricted, whereas, in the latter case, the measurement time is protracted.

In testing for disturbance tolerance, with the use of the tester 200, it is necessary to output the result of decision externally of the semiconductor integrated circuit device 160 from cycle to cycle. Therefore, there is a problem that test time is protracted owing to the limit on the operation frequency of the input/output circuit of the semiconductor integrated circuit device 160 or the frequency of the signal that can be received by the tester 200. On the other hand, if a set of several commands is repeated, and a disturbance is applied to one of the commands to determine the tolerable amount of disturbance, it is necessary that an input signal different from cycle to cycle is generated and supplied to the circuit under test 150. However, if the operation frequency of the external tester 200 is slower than the operation frequency of the circuit under test 150, there is raised a problem that the test time is protracted.

Namely, in testing for disturbance tolerance, with the use of the tester 200, a decision signal needs to be output to outside from cycle to cycle. Therefore, there is a problem that test time is protracted by the limit on the operation frequency of the input/output circuit of the semiconductor integrated circuit device 160 or on the signal frequency that may be received by the tester 200.

Therefore, there is a need in the art to make it possible to measure disturbance tolerance of a circuit under test provided in a semiconductor integrated circuit device without halting the operation of the circuit under test in case the operation frequency of the input/output circuit of the semiconductor integrated circuit device or a tester is lower than the frequency of the test input signal.

A semiconductor integrated circuit device according to a first aspect of the present invention includes: a normal output signal counter that counts number of times a normal output signal is output by the circuit under test in response to a preset one of the input signals of the input signal set, in case where a circuit under test repeats processing on each of one or more input signals of an input signal set sequentially, a plural number of times.

A method for testing a semiconductor integrated circuit device according to a second aspect of the present invention includes: repeating processing on each of one or more input signals of an input signal set sequentially, a plural number of times, by a circuit under test; and counting number of times a normal output signal is output by the circuit under test in response to a preset one of the input signals of the input signal set.

A semiconductor integrated circuit device according to a first modification may further include: an input signal counter that determines as a input signal count a count incremented or decremented in synchronization with a clock signal for the input signal set and outputs the input signal count; and an input signal storage unit that selects one of the input signals composing the input signal set in response to the input signal count and outputs the selected input signal to the circuit under test.

A semiconductor integrated circuit device according to a second modification may further include the circuit under test.

A semiconductor integrated circuit device according to a third modification may further include an input signal disturbance unit that applies disturbance to the circuit under test only during the period of processing the preset input signal and increases or decreases the strength of the disturbance each time the disturbance is applied.

In a semiconductor integrated circuit device according a fourth modification, the input signal disturbance unit refers to the input signal count to apply the disturbance to the circuit under test only during the period when the preset input signal is processed; and the normal output signal counter refers to the input signal count to count a number of times a normal output signal is output in response to the preset input signal.

In the semiconductor integrated circuit device according to a fifth modification, the input signal storage unit may include: one or more input signal registers that record the input signal set; an input signal selection circuit that selects one of the input signals of the input signal set and outputs the selected input signal to the circuit under test; and an ideal output signal register that records an ideal output signal for the preset input signal.

In a semiconductor integrated circuit device according to a sixth modification, the input signal selection circuit refers to the input signal count to select one of the input signals of the input signal set and output the selected signal to the circuit under test.

A method for testing a semiconductor integrated circuit device according to a seventh modification may further include: determining as an input signal count a count that is incremented or decremented in synchronization with a clock signal for the input signal set; and outputting one of the input signals composing the input signal set to the circuit under test in response to the input signal count.

A method for testing a semiconductor integrated circuit device according to an eighth modification may further include: applying disturbance to the circuit under test only during the period of processing the preset input signal; and increasing or decreasing the strength of the disturbance each time the disturbance is applied.

In a method for testing a semiconductor integrated circuit device according to a ninth modification, the disturbance is applied to the circuit under test only during the time of processing the preset input signal based on the input signal count in the applying; and a number of times a normal output signal is output in response to the preset input signal is counted based on the input signal count in the counting.

The present invention provides the following advantage, but not restricted thereto. In the semiconductor integrated circuit device according to the present invention, it is possible to measure disturbance tolerance of a circuit under test provided in a semiconductor integrated circuit device without halting the operation of the circuit under test in case the operation frequency of the input/output circuit of the semiconductor integrated circuit device or a tester is lower than the frequency of the test input signal.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

Explanations of symbols are given in the following description.

PREFERRED MODES

Exemplary Embodiment

A semiconductor integrated circuit device according to an exemplary embodiment will now be described in detail with reference to the drawings.

Figure 1:
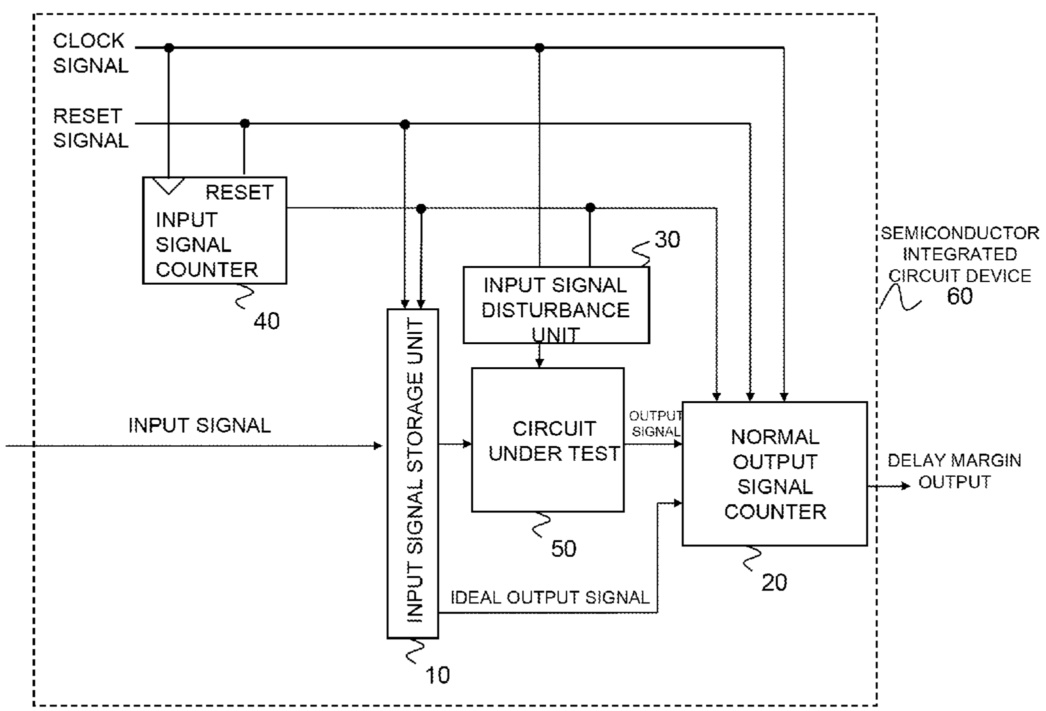
FIG. 1 is a block diagram of a semiconductor integrated circuit device according to an exemplary embodiment.

FIG. 1 depicts a block diagram showing an arrangement of a semiconductor integrated circuit device according to an exemplary embodiment.

Referring to FIG. 1, a semiconductor integrated circuit device 60 sequentially executes an N-number of commands, where N denotes a natural number, on a circuit under test 50. The semiconductor integrated circuit device counts the number of times of correct executions of a K'th command, where K=0, 1, . . . , N−1. Specifically, the semiconductor integrated circuit device 60 includes a normal output signal counter 20 in addition to the circuit under test 50. It is noted that the operation of sequentially executing an N-number of commands in the circuit under test 50 is repeatedly performed a J-number of times, where J is a natural number. The normal output signal counter 20 verifies, after execution of a K'th command, whether or not the output of the circuit under test 50 to the command is correct. After repetition of the above operation by the J-number of times, the normal output signal counter 20 outputs a count value indicating how many times the correct outputs have been obtained.

The semiconductor integrated circuit device 60 sequentially executes an N-number of commands, where N is a natural number, on the circuit under test 50. When the K'th command, where K=0, 1, . . . , N−1, is executed, a disturbance is applied to the input signal. The semiconductor integrated circuit device observes the maximum value of the disturbance for which the command can be correctly executed. The semiconductor integrated circuit device 60 includes, in addition to the circuit under test 50 and the normal output signal counter 20, an input signal disturbance unit 30. It is noted that, when the operation of sequentially executing the N-number of commands on the circuit under test 50 and applying the disturbance to the circuit under test 50 during execution of each K'th command is repeated a J-number of times, where N is a natural number, the input signal disturbance unit 30 varies the amount of the disturbance each time the disturbance is applied. The normal output signal counter 20 outputs a count value of the number of times the correct output has been obtained after the end of the J-number of repetitions.

Preferably, the circuit under test 50 of the semiconductor integrated circuit device 60 inputs one of the N commands, in response to the value of the counter which is incremented from 0 to N−1, or decremented in the reverse order, in synchronization with the clock signal applied to the signal under test.

Also preferably, the counter value, incremented from 0 to N−1 or decremented in the reverse order in synchronization with the clock signal supplied to the signal under test, is imparted to the input signal disturbance unit 30. The input signal disturbance unit may then recognize the K'th command to impart the disturbance to the circuit under test 50. The counter value is applied to the normal output signal counter 20, which then determines the result of execution of the K'th command. After execution of the K'th command, the normal output signal counter determines whether an output is correct or not, and counts up the number of the correct outputs.

Figure 3:
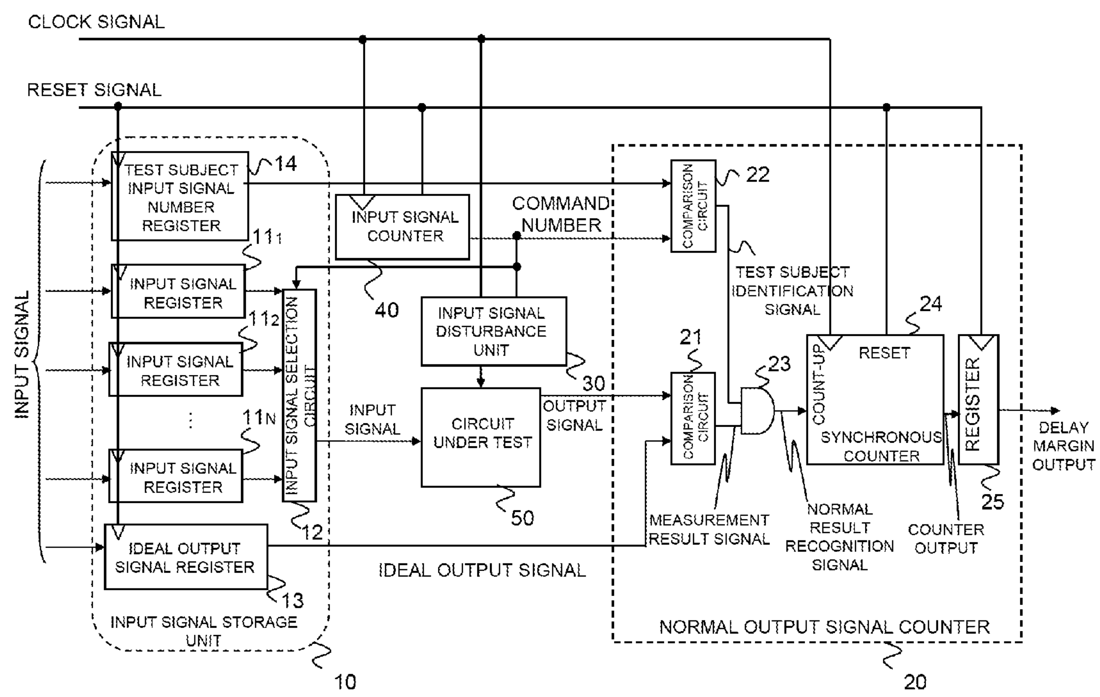
FIG. 3 is a detailed circuit diagram of a semiconductor integrated circuit device according to an exemplary embodiment.

FIG. 3 shows a circuit diagram of the semiconductor integrated circuit device according to the exemplary embodiment.

Also preferably, an input signal storage unit 10 imparts the above mentioned N-number of commands, where N is a natural number, to the circuit under test 50. Referring to FIG. 3, the input signal storage unit 10 preferably includes an N-number of input signal registers $\mathbf{11}_1$ to $\mathbf{11}_N$ that retain an N-number of commands, an input signal selection circuit 12 and an ideal output signal register 13. The input signal selection circuit selects data to be delivered to the circuit under test 50, out of the N commands, based on a control signal, and the ideal output signal register retains an ideal value to be used in making a decision in connection with the K'th command.

Preferably, the control signal, used in the input signal selection circuit 12, is a value of a counter incremented or decremented in a range from 0 to N−1 in synchronization with the clock signal imparted to the signal under test.

Referring to FIG. 1, the semiconductor integrated circuit device 60 includes, in its preferred exemplary embodiment, an input signal storage unit 10, an input signal disturbance unit 30 and a normal output signal counter 20 and an input signal counter 40.

The input signal counter 40 counts from 0 to N−1 every clock cycle. The input signal storage unit 10 retains an N-number of the input signals and selects one of the signals, depending on the count value, to output the selected signal. The input signal disturbance unit 30 generates the disturbance only for a count value of K, K being an integer from 0 to N−1, and increases the disturbance. The normal output signal counter 20 determines whether or not the output signal for the K'th input signal is normal, and counts the number of times the normal output signal has been obtained. After the end of testing, the normal output signal counter 20 delivers an ultimate count value as output.

The normal output signal counter 20 is able to determine for up to which value of the disturbance applied to the K'th input signal a normal output signal may be obtained.

Figure 4:
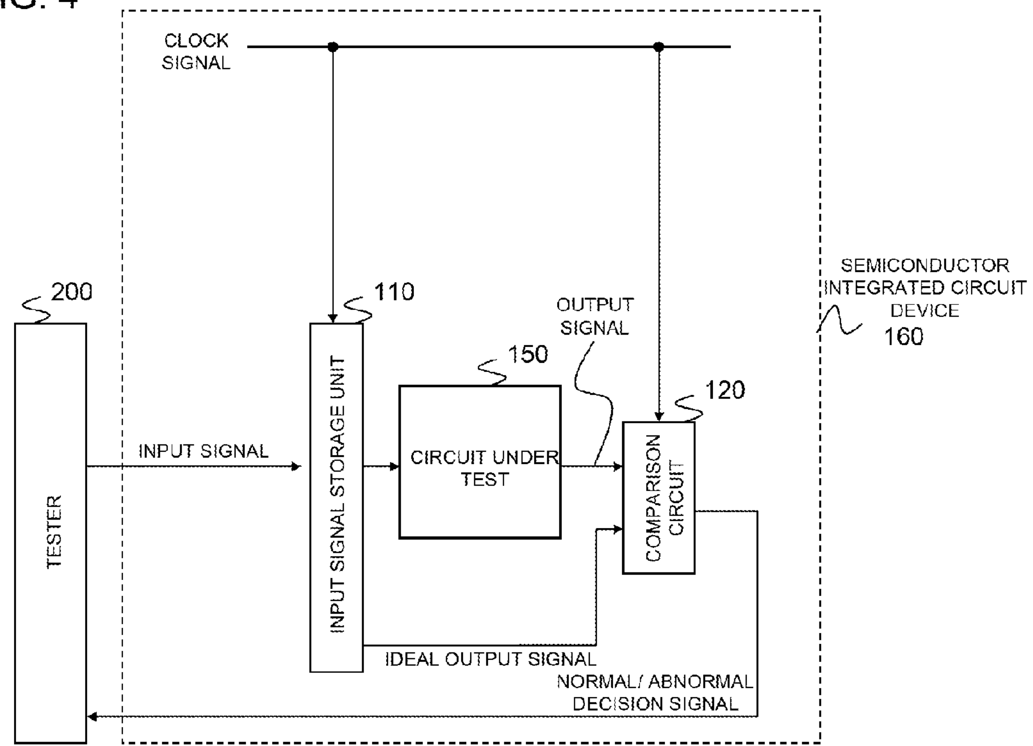
FIG. 4 is a block diagram showing a conventional semiconductor integrated circuit device.
Figure 5:
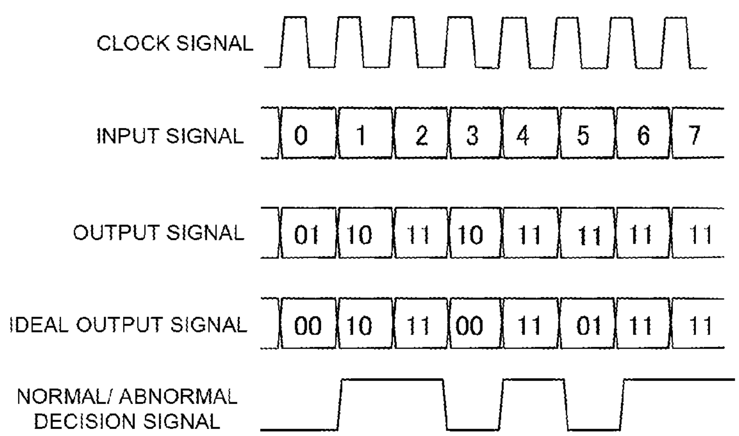
FIG. 5 is a timing chart for a conventional semiconductor integrated circuit device.
Figure 6:
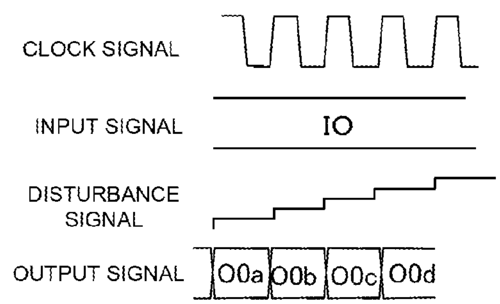
FIG. 6 is a timing chart for a case where a unitary input signal is processed and the strength of the disturbance is varied.
Figure 7:
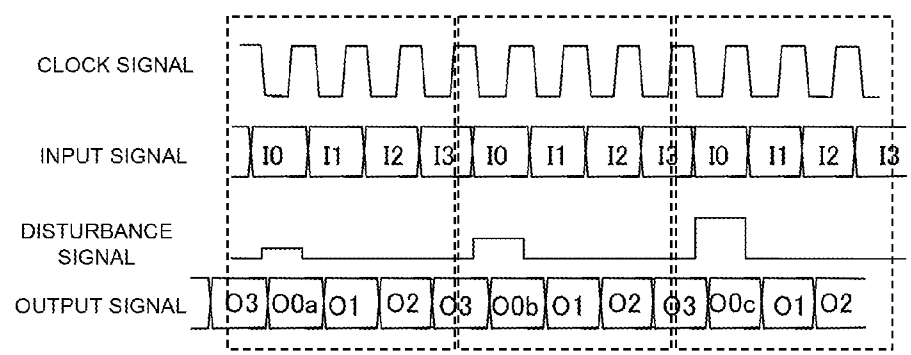
FIG. 7 is a timing chart for a case where a set of a plurality of input signals is repeatedly processed and the strength of the disturbance is varied for a specified one of the input signals.

Thus, in the semiconductor integrated circuit device 60, it is unnecessary to output a normal or abnormal decision signal to the tester 200 externally of the semiconductor integrated circuit device 160 to measure the disturbance tolerance, from one period to another, in contradistinction from the case shown in FIGS. 4 and 5. In addition, in the semiconductor integrated circuit device 60, the disturbance tolerance may be obtained by taking out an output value of the normal output signal counter 20 only once on termination of the repetitive measurements. Viz., even in case the signal frequency of the signal that can be received by the tester 200 or the limit of the operation frequency of the input/output circuit of the semiconductor integrated circuit device 60 is lower than the frequency of the test input signal, the disturbance tolerance may be measured without halting the operation of the circuit under test 50.

Moreover, in measuring the disturbance tolerance that depend on the combination of a plurality, or an N-number, of input signals, it is unnecessary to deliver the input signal to the semiconductor integrated circuit device 60 from one period to another. Instead, it is only necessary to pre-store an N-number of the input signals and the ideal output signal for the K'th input signal in the input signal storage unit 10. The input signals may then be sequentially selected, in response to the count value of the input signal counter 40, and the selected input signals may sequentially be delivered to the circuit under test 50. Viz., even in case the signal frequency of the signal that can be received by the tester or the operation frequency of the input/output circuit of the semiconductor integrated circuit device 60 is lower than the frequency of the test input signal, the disturbance tolerance of the circuit under test 50 may be measured without halting the operation of the circuit under test.

EXAMPLES

An example of the semiconductor integrated circuit device according to an example will now be described in detail with reference to the drawings.

FIG. 1 is a block diagram showing an arrangement of a semiconductor integrated circuit device of the present example.

Referring to FIG. 1, the semiconductor integrated circuit device 60 includes the input signal counter 40 that counts in a range between 0 and N−1, from one clock cycle to another, and the input signal storage unit 10. The input signal storage unit holds an N-number of input signals and selects one of the signals in response to the count of the input signal counter 40 (input signal count) to output the signal selected. The semiconductor integrated circuit device also includes the input signal disturbance unit 30 and the normal output signal counter 20. The input signal disturbance unit 30 generates the disturbance only when the input signal count is K, where K is an integer from 0 to N−1, and increases the disturbance. The normal output signal counter 20 determines whether or not an output signal for the K'th input signal is normal. The normal output signal counter 20 counts the number of times the normal output signal has been obtained to deliver an ultimate count (normal output signal count) as output after the end of the measurement.

Figure 2:
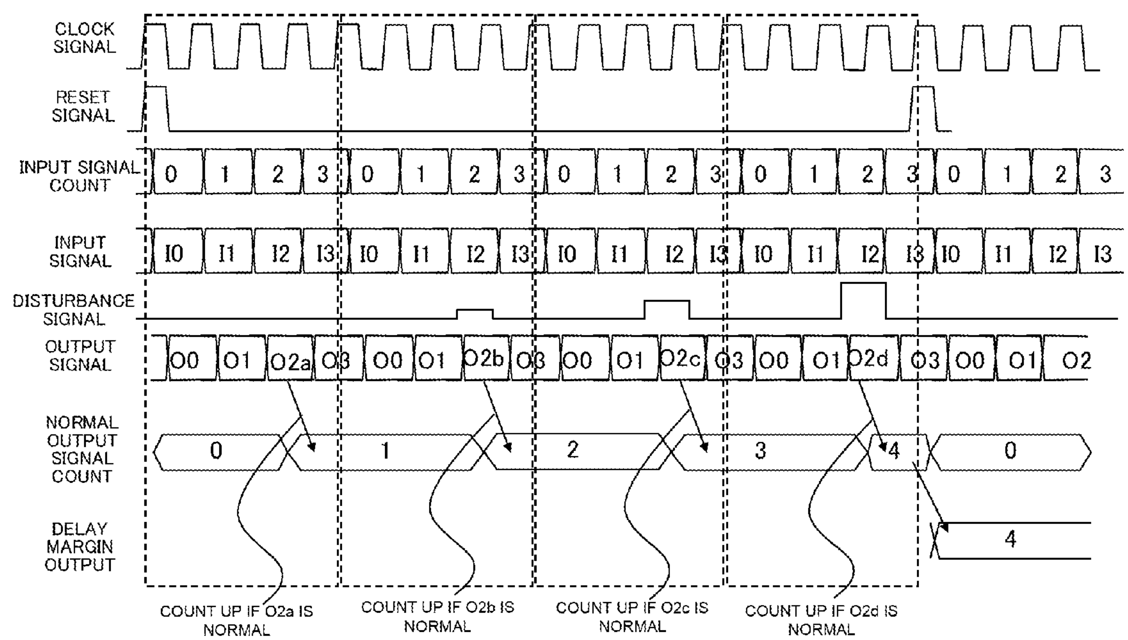
FIG. 2 is a timing chart for the semiconductor integrated circuit device according to an exemplary embodiment.

FIG. 2 depicts a timing diagram for the semiconductor integrated circuit device 60 according to the present example.

The case where N=4 and K=2 is taken as an instance for explanation. If the input signal count is i (i=1, . . . , 4), an input signal Ii out of the four input signals of a set {I0, I1, I2 and I3} is processed.

Now, K=2. Hence, the input signal disturbance unit 30 imparts the disturbance to the circuit under test 50 when the input signal count is 2, viz., in processing the input signal I2.

As a first-time processing, the input signals I0 to I3 are processed each only once. If the disturbance is imparted during execution of the input signal I2, the normal output signal counter 20 determines whether or not an output signal 02*a*, obtained on processing the input signal I2 by the circuit under test 50, is normal. If the output signal 02*a* is normal, the normal output signal counter increments the normal output signal count in the normal output signal counter 20 by one. The input signal count then becomes 3, so that the input signal I3 is processed. In the next cycle, the input signal count reverts to 0, and the processing of the above input signal set (I0 to I3) is repeated. It is observed that, in processing the input signal I2, the disturbance imparted to the circuit under test 50 is set so as to be greater than that imparted first time.

In the second processing, the normal output signal counter 20 again determines whether or not the output signal 02*b* of the circuit under test 50 for the input signal I2 is normal. If the output signal is normal, the normal output signal counter increments the normal output signal count in the normal output signal counter 20 by one. After repeating the above processing a preset number of times, the test on the semiconductor integrated circuit device 60 comes to an end. FIG. 2 shows a case where the semiconductor integrated circuit device 60 has repeated processing on the set of the input signals I0 to I3 four times.

The normal output signal count in the normal output signal counter 20 indicates the number of times the circuit under test 50 has output the normal output signals 02*a*, 02*b*, 02*c* and 02*d* by processing on the input signal I2. Viz., the normal output signal count indicates for up to which value of the disturbance applied the circuit under test 50 is able to correctly process the input signal I2.

For example, it is supposed that the disturbance with a preset strength a is imparted in the processing of the first input signal I2, and the strength of the disturbance is progressively increased a preset amount each time, such as by imparting the disturbance of the strength 2$\alpha$ and that of the strength 3$\alpha$ in the processing for second and third times, respectively. The disturbance tolerance allowed on the input signal I2 in such case may be represented by (normal output signal count×$\alpha$).

Hence, in the semiconductor integrated circuit device 60, it is unnecessary to deliver an output signal or a normal/abnormal decision signal to the tester 200 outside the semiconductor integrated circuit device 160 from one cycle to another as is done in the conventional scheme. To acquire the disturbance tolerance, it is only sufficient for the semiconductor integrated circuit device 60 to take out the normal output signal count at the normal output signal counter 20 only once after the end of the measurement operation in its entirety. Viz., even in case the signal frequency of the signal that can be received by the tester 200 or the limit of the operation frequency of the input/output circuit of the semiconductor integrated circuit device 60 is lower than the frequency of the test input signal, the result of decision as to whether the circuit under test 50 is normal or abnormal may be obtained without halting the operation of the circuit under test 50. In addition, it is also possible to measure the amount of the disturbance tolerance of the circuit under test 50. Thus, with the semiconductor integrated circuit device 60, the test time may be made shorter than with the conventional test method.

The semiconductor integrated circuit device 60 may recognize the beginning and the end of the above described sequence of operations of repeating the processing on the set of the input signals, composed of the N-number of input signals, a preset number of times, by the rising of a reset signal. When the reset signal rises, the normal output signal counter 20 outputs the normal output signal count, after which it resets the value of the normal output signal count to zero. An input signal set generator, not shown, generates a new set of the input signals. Hence, the output period of the reset signal and an output of the normal output signal counter 20 is (clock period)×N×(number of times of repetitive processing on the input signal set).

FIG. 3 depicts a detailed circuit diagram of the input signal storage unit 10 and the normal output signal counter 20 provided in the semiconductor integrated circuit device 60 according to the present example.

Referring to FIG. 3, the input signal storage unit 10 includes input signal registers $\mathbf{11}_1$ to $\mathbf{11}_N$ that record and hold the N input signals of the input signal set, and the input signal selection circuit 12 that selects one of the input signals of the set. The input signal storage unit also includes the ideal output signal register 13 and a test subject input signal number register 14.

In the above mentioned instance, the N input signals of the input signal set {I0, I1, I2 and I3} are respectively recorded in the input signal registers $\mathbf{11}_1$ to $\mathbf{11}_N$. The input signal selection circuit 12 is responsive to the input signal count to select one of the input signals from the N input signal registers $\mathbf{11}_1$ to $\mathbf{11}_N$ to deliver the so selected signal to the circuit under test 50. The test subject input signal number register 14 retains the value of K. The ideal output signal register 13 pre-stores an output signal (an ideal output signal) that may be expected to be produced in processing the K'th input signal, which is the $I_2$ signal in the above example with K=2. After the processing of the K'th input signal $I_K$, a comparison circuit 21, provided in the normal output signal counter 20, compares the ideal output signal to an output signal of the circuit under test 50. If the two signals coincide, the comparison circuit 21 outputs one as a measurement result signal. On the other hand, if the input signal count coincides with the test subject input signal number, the comparison circuit 22 outputs one as a test subject identification signal.

An AND circuit 23 inputs a measurement result signal and the test subject identification signal and outputs the result of the AND operation to a synchronous counter 24. By the above circuit arrangement, the normal output signal counter 20 is able to determine whether or not the output signal from the circuit under test 50 corresponds to the K'th input signal. In case a normal output signal has been obtained for the K'th input signal, the synchronous counter 24 increments the normal output signal count by one.

The semiconductor integrated circuit device 60 of the present example is particularly effective for such a case where the same command set is repetitively measured and the disturbance tolerance are found based on the measured results. If, in this case, the set of the N-number of commands is pre-stored in the input signal storage unit 10, a sequence of operations of sequentially executing an N-number of commands, in keeping with the command count values, progressively varying the disturbances at the time of execution of the K'th commands, saving the result in the normal output signal counter 20 and outputting the results after repeated measurements as the disturbance tolerance, may be executed without re-inputting the data. Thus, even in case the signal frequency of the signal that can be transmitted by a tester or the limit of the operation frequency of the LSI input/output circuit is lower than the frequency of the signal under test, the disturbance tolerance of the circuit under test 50 may be measured without halting the operation of the circuit under test during the time of transmitting data from the tester.

It is apparent that the present invention is not limited to the above example which may be changed in a desired manner within the scope of the technical concept of the present invention. A large variety of combinations or selections of the disclosed elements may also be made within the scope of the invention as defined in the claims. It is to be noted that the present invention comprehends a large variety of changes or modifications that may be made by those skilled in the art in accordance with the total disclosures and technical concepts including the claims.

The invention claimed is:

1. A semiconductor integrated circuit device comprising:

a normal output signal counter that, in a case where a circuit under test repeats processing on each of input signals of an input signal set sequentially a plural number of times, counts a number of times a normal output signal is output by said circuit under test in response to a preset input signal out of said input signals of said input signal set;

an input signal counter that determines as an input signal count a count incremented or decremented in synchronization with a clock signal for said input signal set and outputs the input signal count; and an input signal storage unit that selects one of said input signals composing said input signal set in response to said input signal count and outputs the selected input signal to said circuit under test.

2. The semiconductor integrated circuit device according to claim 1, further comprising:

an input signal disturbance unit that applies disturbance to said circuit under test only during the period of processing said preset input signal and increases or decreases the strength of said disturbance each time said disturbance is applied.

3. The semiconductor integrated circuit device according to claim 2, wherein said input signal disturbance unit refers to said input signal count to apply said disturbance to said circuit under test only during the period when said preset input signal is processed; and said normal output signal counter refers to said input signal count to count said number of times a normal output signal is output in response to said preset input signal.

4. The semiconductor integrated circuit device according to claim 2, wherein said input signal storage unit includes:

one or more input signal registers that record said input signal set;

an input signal selection circuit that selects one of said input signals of said input signal set and outputs the selected input signal to said circuit under test; and an ideal output signal register that records an ideal output signal for said preset input signal.

5. The semiconductor integrated circuit device according to claim 4, wherein said input signal selection circuit refers to said input signal count to select one of said input signals of said input signal set and output the selected signal to said circuit under test.

6. A method for testing a semiconductor integrated circuit device, the method comprising:

repeating processing on each of input signals of an input signal set sequentially, a plural number of times, by a circuit under test; and counting a number of times a normal output signal is output by said circuit under test in response to a preset input signal out of said input signals of said input signal set;

determining as an input signal count a count that is incremented or decremented in synchronization with a clock signal for said input signal set; and outputting one of said input signals composing said input signal set to said circuit under test in response to said input signal count.

7. The method for testing a semiconductor integrated circuit device according to claim 6, further comprising:

applying disturbance to said circuit under test only during the period of processing said preset input signal; and increasing or decreasing the strength of said disturbance each time said disturbance is applied.

8. The method for testing a semiconductor integrated circuit device according to claim 7, wherein said disturbance is applied to said circuit under test only during the time of processing said preset input signal based on said input signal count in said applying; and said number of times a normal output signal is output in response to said preset input signal is counted based on said input signal count in said counting.

* * * * *